United States Patent
Wakaki et al.

(10) Patent No.: US 7,466,519 B2
(45) Date of Patent: Dec. 16, 2008

(54) WIRED CIRCUIT BOARD FOR CONTROLLING CHARACTERISTIC IMPEDANCES OF A CONNECTION TERMINAL

(75) Inventors: Shuichi Wakaki, Osaka (JP); Tadao Ohkawa, Osaka (JP); Yasuhito Ohwaki, Osaka (JP)

(73) Assignee: Nitto Denko Corporation, Osaka (JP)

( * ) Notice: Subject to any disclaimer, the term of this patent is extended or adjusted under 35 U.S.C. 154(b) by 453 days.

(21) Appl. No.: 10/859,150

(22) Filed: Jun. 3, 2004

(65) Prior Publication Data

US 2004/0246626 A1     Dec. 9, 2004

(30) Foreign Application Priority Data

Jun. 3, 2003  (JP)  ............... 2003-157478

(51) Int. Cl.
  G11B 5/54   (2006.01)
  H05K 1/03   (2006.01)
(52) U.S. Cl. .................... 360/245.9; 174/255
(58) Field of Classification Search ........ 360/244, 360/245.8, 245.9, 244.3; 174/250, 254, 260, 174/255
See application file for complete search history.

(56) References Cited

U.S. PATENT DOCUMENTS

| | | | |
|---|---|---|---|
| 4,856,181 A * | 8/1989 | Pichler et al. ............ 29/603.14 |
| 5,065,271 A | 11/1991 | Matsuura et al. |
| 5,712,749 A | 1/1998 | Gustafson |
| 5,796,552 A * | 8/1998 | Akin et al. ............... 360/264.2 |
| 5,805,382 A * | 9/1998 | Lee et al. ................ 360/244.1 |
| 5,883,759 A | 3/1999 | Schulz |
| 5,978,177 A * | 11/1999 | Takasugi ................. 360/245.9 |
| 5,995,329 A | 11/1999 | Shiraishi et al. |
| 6,291,775 B1 * | 9/2001 | Saitoh ..................... 174/250 |
| 6,459,043 B1 * | 10/2002 | Dodsworth ............... 174/254 |
| 6,480,359 B1 * | 11/2002 | Dunn et al. ............. 360/245.9 |
| 6,728,071 B2 * | 4/2004 | Shimizu ................... 360/244.1 |
| 6,841,737 B2 * | 1/2005 | Komatsubara et al. ...... 174/250 |
| 6,894,875 B2 * | 5/2005 | Serizawa et al. ......... 360/264.2 |
| 6,942,817 B2 * | 9/2005 | Yagi et al. ................ 216/57 |
| 6,963,471 B2 * | 11/2005 | Arai et al. ................ 360/246 |

(Continued)

FOREIGN PATENT DOCUMENTS

JP     03239388 A   * 10/1991

(Continued)

*Primary Examiner*—Brian E Miller
(74) *Attorney, Agent, or Firm*—Jean C. Edwards, Esq.; Akerman Senterfitt (57) ABSTRACT

A wired circuit board is provided for controlling characteristic impedance at connection points between the read wire and write wire of a suspension board with circuit and terminal portions of the wired circuit board connected thereto. The invention provides improved signal transmission efficiency for fine pitch wiring or for high frequency signal. A conductive board is adhesively bonded to an insulating base layer of the wired circuit board at one side thereof opposite to the other side on which a suspension-board-side connection terminal portion is formed having a first terminal portion that connects with a read wire of the suspension board and a second terminal portion that connects with a write wire of the suspension board. An opening is provided adjacent to one of the first terminal portion and the second terminal portion and a stiffener board is adhesively bonded to the conductive board via an adhesive layer.

2 Claims, 4 Drawing Sheets

U.S. PATENT DOCUMENTS

| | | | |
|---|---|---|---|
| 7,067,912 B2 * | 6/2006 | Takeuchi et al. | 257/688 |
| 2002/0007961 A1 * | 1/2002 | Yamato et al. | 174/250 |
| 2002/0100609 A1 * | 8/2002 | Ookawa et al. | 174/255 |
| 2002/0105760 A1 | 8/2002 | Someya | |
| 2002/0181156 A1 * | 12/2002 | Shiraishi et al. | 360/245.9 |
| 2005/0061542 A1 * | 3/2005 | Aonuma et al. | 174/255 |
| 2007/0295534 A1 * | 12/2007 | Ishii et al. | 174/261 |

FOREIGN PATENT DOCUMENTS

| | | |
|---|---|---|
| JP | 9-282624 | 10/1997 |
| JP | 10-003632 | 1/1998 |
| JP | 2001-143423 | 5/2001 |
| JP | 2002-222578 | 8/2002 |
| JP | 2002-237013 | 8/2002 |

* cited by examiner

FIG. 6

WIRED CIRCUIT BOARD FOR CONTROLLING CHARACTERISTIC IMPEDANCES OF A CONNECTION TERMINAL This application claims priority from Japanese Patent Application No. 2003-157478, filed Jun. 3, 2003, the entire contents of which are herein incorporated by reference to the extent allowed by law.

BACKGROUND OF THE INVENTION

1. Field of the Invention

The present invention relates to a wired circuit board to connect with a suspension board with circuit equipped with a magnetic head of a hard disk drive.

2. Description of the Prior Art

In the hard disk drive, the suspension board with circuit equipped with the magnetic head has read lines and write lines for transmitting read signals and write signals to the magnetic head. The read lines and the write lines are connected to terminal portions of the wired circuit board equipped with an electronic device such as a preamplifier integrated circuit (IC). The read signals from the read lines and the write signals from the write lines are amplified by the electronic device such as the preamplifier IC placed on the wired circuit board and then transmitted from the wired circuit board to a control circuit board for controlling the magnetic head.

Meanwhile, along with improvement in recent years to fine pitch wiring and to high frequency signal, it is increasingly becoming necessary to control characteristic impedances at connection points between the read lines and write lines of the suspension board with circuit and the terminal portions of the wired circuit board connected thereto.

If there is inconsistency in characteristic impedance at the connection points, transmission efficiency of the signal will be reduced. Particularly, the signal before input to the preamplifier IC (the signal before it is amplified) is so weak that it is easily affected by the characteristic impedance at the connection points, so that the transmission efficiency of the signal is reduced easily.

For example, U.S. Pat. No. 5,712,749 proposes improvement of this suspension board with circuit, according to which an opening is formed in the stainless board at a location under the wires, to optimize the capacitance of the signal, so as to control the characteristic impedance. This proposed construction can control the characteristic impedance of the suspension board with circuit itself, but it cannot control the characteristic impedances at the connection points between the read wire and write wire of the suspension board with circuit and the terminal portions of the wired circuit board connected thereto. Accordingly, the problem of the reduction in transmission efficiency at the connection points remains unavoidable.

The terminal portions, in particular, which are in the form of connection pads, are usually formed to be larger in width than the wires. Due to this, the capacitance is increased at the terminal portions, so that the characteristic impedance is rendered discrete thereat, to cause reflection of the signal. Thus, it is increasingly becoming important to control the characteristic impedance at the connection points.

SUMMARY OF THE INVENTION

The invention provides a wired circuit board that can control characteristic impedance at connection points between the read wire and write wire of a suspension board with circuit and terminal portions of the wired circuit board connected thereto with a simple structure, to improve signal transmission efficiency for fine pitch wiring or for high frequency signal.

The present invention provides a novel wired circuit board to connect with a suspension board with circuit having a read wire and a write wire, the wired circuit board comprising an insulating layer, a first terminal portion to connect with the read wire and a second terminal portion to connect with the write wire on one surface of the insulating layer, and a ground layer formed on the other surface of the insulating layer, the ground layer having an opening formed at a portion thereof overlapping with either of the first terminal portion and the second terminal portion. In the wired circuit board of the present invention, the ground layer may comprise a stiffener board and a conductive board interposed between the insulating layer and the stiffener board, and the opening may be formed in the conductive board.

Alternatively, in the wired circuit board of the present invention, the ground layer may comprise a stiffener board, and the opening may be formed in the stiffener board.

This construction of the wired circuit board of the present invention can allow reduction in capacitance at the connection points between the read wire and write wire of the suspension board with circuit and the first and second terminal portions of the present invention connected thereto, to control the characteristic impedance.

Hence, the wired circuit board of the present invention can achieve improvement in signal transmission efficiency for the suspension board with circuit having the read wire and the write wire and the wired circuit pattern of the wired circuit board of the present invention, even when the wirings are formed with fine pitch or even when the high-frequency signal is transmitted.

DETAILED DESCRIPTION OF THE INVENTION

Figure 1:
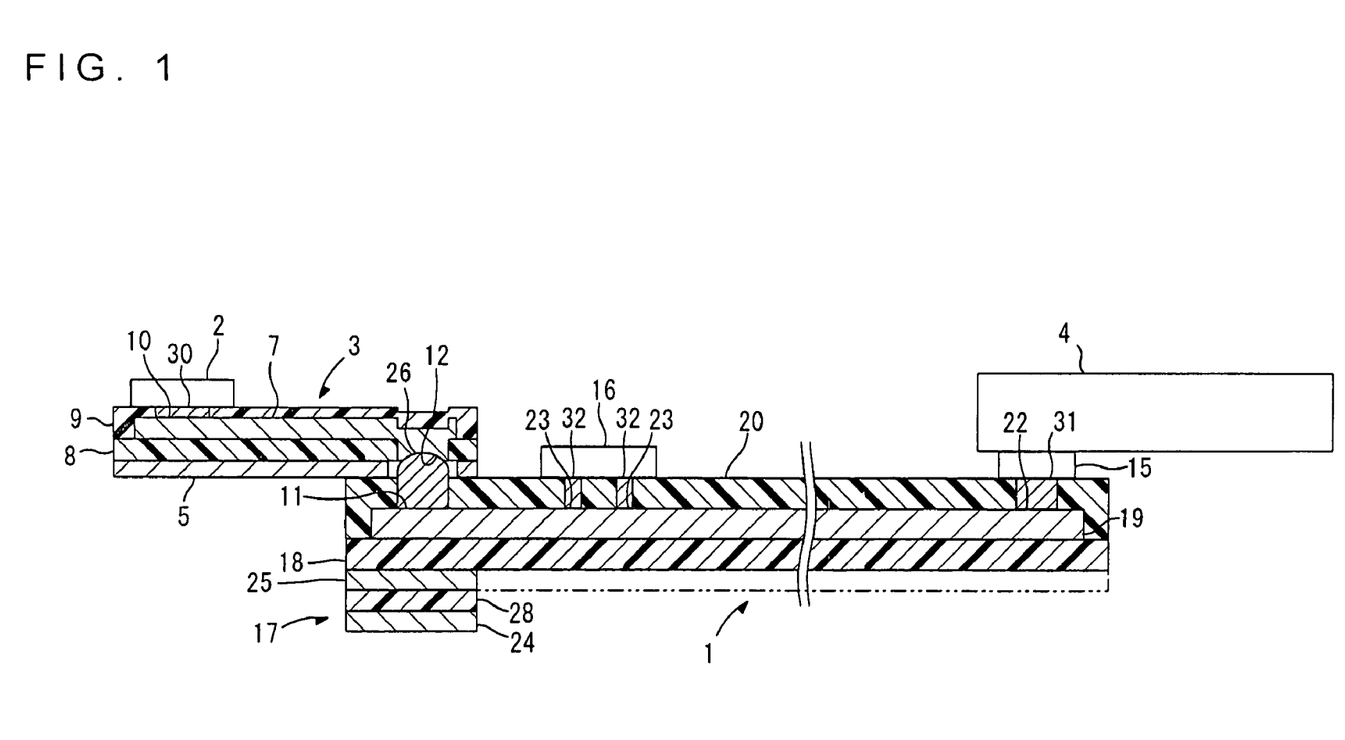
FIG. 1 is a sectional view taken along a longitudinal direction of an embodiment of a wired circuit board of the present invention (having a ground layer comprising a stiffener board and a conductive plate)
Figure 2:
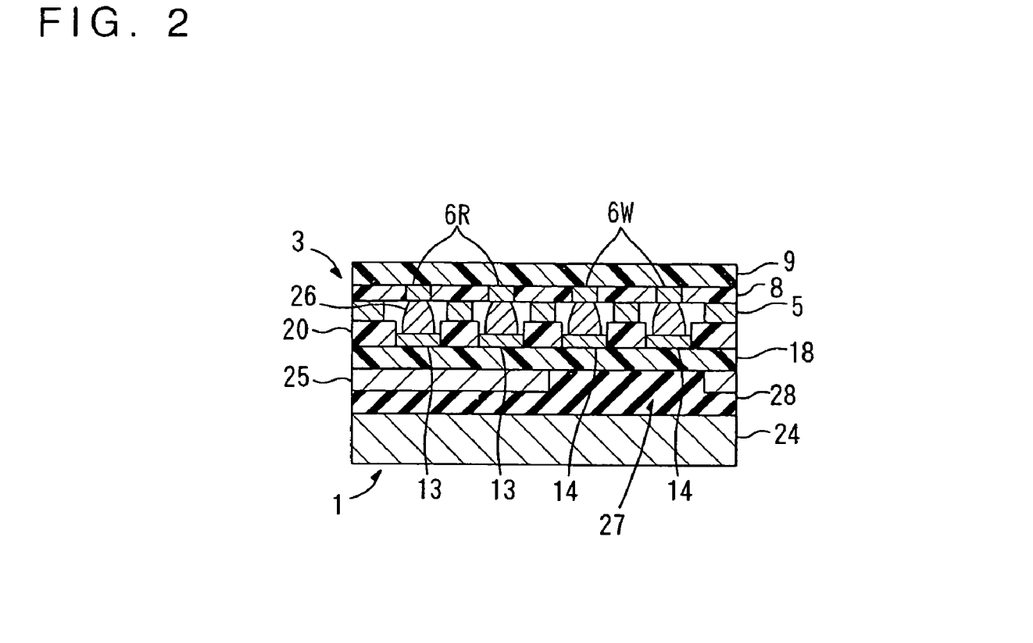
FIG. 2 is a sectional view taken along a direction orthogonal to the longitudinal direction of the wired circuit board shown in FIG. 1 at a connection terminal portion thereof on a suspension board side.
Figure 3:
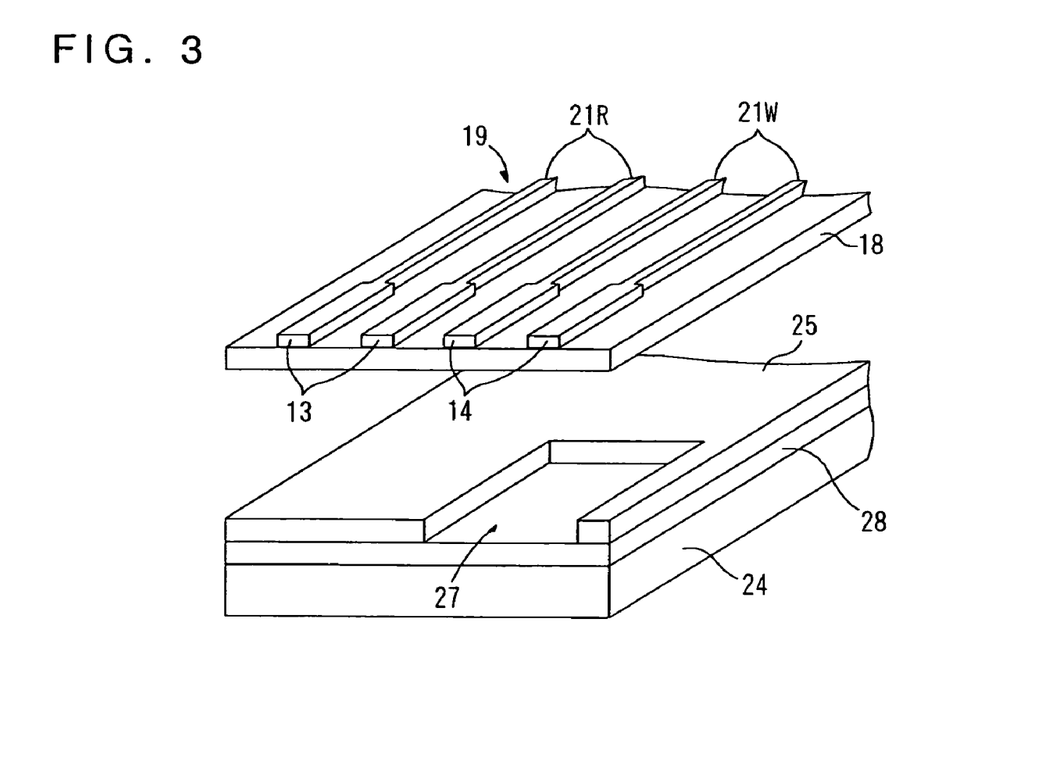
FIG. 3 is a perspective view of a principal part of the wired circuit board shown in FIG. 1 at the connection terminal portion thereof on the suspension board side.

FIG. 1 is a sectional view taken along a longitudinal direction of a relay flexible wiring circuit board as an embodiment of a wired circuit board of the present invention. FIG. 2 is a sectional view taken along a direction orthogonal to the longitudinal direction of the relay flexible wiring circuit board at a connection terminal portion thereof on a suspension board side. FIG. 3 is a perspective view of a principal part of the suspension-board-side connection terminal portion.

In FIG. 1, a relay flexible wiring circuit board 1 is a flexible wired circuit board used for connecting between a long-tail type suspension board with circuit 3 equipped with a magnetic head 2 of a hard disk drive and a control circuit board 4 for controlling the magnetic head 2.

The magnetic head 2 is arranged at a front end portion of the suspension board with circuit 3 and is supported above a rapidly spinning magnet disk (not shown) with a minute distance therefrom so that a right flying state of the magnetic head 2 can be held against an airflow generated in the minute gap between the magnetic head 2 and the magnetic disk.

The suspension board with circuit 3 comprises a flexible metal board 5 and a wired circuit pattern 7 comprising read wires 6R (FIG. 2) and write wires 6W (FIG. 2). The flexible metal board 5 and the wired circuit pattern 7 are formed to be integral with each other. To be more specific, an insulating base layer 8 of polyimide or the like is formed on the metal board 5 of a stainless foil or the like, and the wired circuit pattern 7 of a copper foil or the like (which comprises the read wires 6R and write wires 6W spaced apart from each other at a predetermined distance and arranged in parallel along the longitudinal direction of the suspension board with circuit 3) is formed on the insulating base layer 8. Further, the wired circuit pattern 7 is covered with an insulating cover layer 9.

The suspension board with circuit 3 has, at a front end portion thereof, a connection terminal portion 10 located on the magnet head side (hereinafter it is referred to as "the magnet-head-side connection terminal portion 10") to connect the suspension board with circuit 3 with the magnetic head 2. The magnet-head-side connection terminal portion 10 is formed by opening the insulating cover layer 9 to expose the read wires 6R and write wires 6W therefrom. The magnetic head 2 is connected to this magnet-head-side connection terminal portion 10 (or the exposed read wires 6R and write wires 6W) through a connection pad 30.

Also, the suspension board with circuit 3 has, at a rear end portion thereof, a connection terminal portion 12 located on the wired circuit board side (hereinafter it is referred to as "the wired-circuit-board-side connection terminal portion 12") to connect the suspension board with circuit 3 with a connection terminal portion 11 of a relay flexible wiring circuit board 1 located on the suspension board side (hereinafter it is referred to as "the suspension-board-side connection terminal portion 11") mentioned next. The wired-circuit-board-side connection terminal portion 12 is formed by opening the insulating base layer 8 and the metal board 5 to expose the read wires 6R and write wires 6W therefrom. The suspension-board-side connection terminal portion 11 (or first terminal portions 13 and second terminal portions 14, mentioned later) is connected to this wired-circuit-board-side connection terminal portion 12 (or the exposed read wires 6R and write wires 6W) through a solder bump 26.

A connector 15 of the relay flexible wiring circuit board 1 mentioned next is connected to the control circuit board 4.

The relay flexible wiring circuit board 1 has, at a lengthwise front end portion thereof, the suspension-board-side connection terminal portion 11 and a ground layer 17. It also has, at a lengthwise rear end portion thereof, a terminal portion 22 on the connector side (hereinafter it is referred to as "the connector-side terminal portion 22") to which the connector 15 is connected. Further, it has, at a lengthwise intermediate portion thereof, a terminal portion 23 on the preamplifier IC side (hereinafter it is referred to as "the IC-side terminal portion 23") to which a preamplifier IC 16 is connected.

The relay flexible wiring circuit board 1 has a basic structure that a conductor layer 19 is formed in the form of a predetermined wired circuit pattern on an insulating base layer 18 and also the conductor layer 19 is covered with an insulating cover layer 20.

To be more specific, the wired circuit pattern of the conductor layer 19 has a plurality of (two) read lines 21R for transmitting read signals from the suspension board with circuit 3 to the control circuit board 4 and a plurality of (two) write lines 21W for transmitting write signals from the control circuit board 4 to the write wires 6W of the suspension board with circuit 3, as shown in FIG. 3. The read lines 21R and the write lines 21W are spaced apart from each other at a predetermined distance and arranged in parallel. Also, all the read lines 21R and write lines 21W are spaced apart from each other at a predetermined distance and arranged in parallel, respectively. In other words, this wired circuit pattern is in the form of a four line pattern comprising two read lines 21R and two write lines 21W which are spaced apart from each other at a predetermined distance (e.g. 10-200 μm, or preferably 25-100 μm) and arranged in parallel.

The suspension-board-side connection terminal portion 11 is formed at the front end portion of the relay flexible wiring circuit board 1 by opening the insulating cover layer 20 to expose the read lines 21R and write lines 21W therefrom, as shown in FIG. 1. Exposed portions of the read lines 21R and write lines 21W from the openings of the insulating cover layer 20 serve as the first terminal portions 13 and the second terminal portions 14, respectively, as shown in FIGS. 2 and 3. The first terminal portions 13 and the second terminal portions 14 are in the form of connection pad and are formed to be larger in width than the read lines 21R and the write lines 21W, respectively. The solder bumps 26 are formed on the first and second terminal portions 13, 14.

The read wires 6R and the write wires 6W of the wired-circuit-board side connection terminal portion 12 of the suspension board with circuit 3 are connected to the first terminal portion 13 and the second terminal portion 14, respectively, through the solder bumps 26, as mentioned above.

The ground layer 17 is arranged to oppose to the suspension-board-side connection terminal portion 11, on the side opposite to the side where the first terminal portions 13 and the second terminal portions 14 are formed on the insulating base layer 18, as shown FIG. 2.

This ground layer 17 comprises a stiffener board 24 and a conductive board 25 interposed between the insulating base layer 18 and the stiffener board 24, as shown in FIGS. 2 and 3.

The conductive board 25 has a generally rectangular plate-like form and has a generally rectangular opening 27 formed at a portion thereof corresponding to either of the first terminal portion 13 and the second terminal portion 14 (at the portion thereof corresponding to the write line 21W side in FIGS. 2 and 3). The conductive board 25 is laminated on the insulating base layer 18 via an adhesive layer, if necessary (In FIGS. 2 and 3, the conductive board 25 is laminated directly on the insulating base layer 18 by the method mentioned later).

The stiffener board 24 has a generally rectangular plate-like form and is adhesively bonded to the conductive board 25 (including the insulating base layer 18 exposed from the opening 27) via an adhesive layer, if necessary (In FIGS. 2 and 3, the stiffener board 24 is adhesively bonded to the conductive board 25 via an adhesive layer 28 by the method mentioned later).

The connector-side terminal portion 22 is formed at the rear end portion of the relay flexible wiring circuit board 1 by opening the insulating cover layer 20 to expose the read lines 21R and write lines 21W therefrom, as shown in FIG. 1. The connector 15 for connecting the connector-side terminal portion 22 to the control circuit board 4 is connected to the exposed portions of the read lines 21R and write lines 21W via a connection pad 31.

Also, the IC-side terminal portion 23 is formed at the intermediate portion of the relay flexible wiring circuit board 1 by opening the insulating cover layer 20 to place the preamplifier IC 16 at a lengthwise intermediate portion of the read lines 21R and write lines 21W. The preamplifier IC 16 is connected to the IC-side terminal portion 23 via a connection pad 32.

A brief description on the method for producing this relay flexible wiring circuit board 1 is given here.

Any insulating material commonly used as the insulating material of the wired circuit board may be used for the insulating base layer 18 and the insulating cover layer 20. For example, synthetic resin, such as polyimide, polyether nitrile, polyether sulfone, polyethylene terephthalate resin, polyethylene naphthalate resin, and polyvinyl chloride resin, can be cited. Polyimide resin is preferably used. The insulating base layer 18 usually has a thickness in the range of 5-100 μm, or preferably 8-50 μm. The insulating cover layer 20 usually has a thickness in the range of 5-100 μm, or preferably 8-50 μm.

Any conductive material commonly used as the conductive material of the wired circuit board may be used for the conductor layer 19. For example, metal, such as copper, nickel, gold, solder, or alloys thereof may be used for the conductor layer 19. Copper is preferably used. The conductor layer 19 usually has a thickness in the range of 5-50 μm, or preferably 8-35 μm.

The conductive board 25 is formed of metal foil, such as a foil of copper, nickel, gold, solder, or alloy thereof. The conductive board 25 usually has a thickness in the range of 3-50 μm, or preferably 8-35 μm.

The stiffener board 24 is formed of metal foil, such as a foil of aluminum, copper, or stainless steel. The stiffener board 24 usually has a thickness in the range of 15-300 μm, or preferably 50-150 μm.

The relay flexible wiring circuit board 1 is formed in the following manner. First, the insulating material is formed into a dry film and the like by a known method, to form the insulating base layer 18. Then, the conductor layer 19 is formed in the form of the above mentioned wired circuit pattern on the insulating base layer 18 by a known patterning process, such as an additive process, a semi-additive process, or a subtractive process. The insulating material in the form of dry film or the like is laminated on the conductor layer 19 by a known process, to form the insulating cover layer 20.

The lamination of the insulating base layer 18, the conductor layer 19 and the insulating cover layer 20 may be formed by a proper method. For example, they are adhesively bonded by the application of adhesive to between the insulating base layer 18 and the conductor layer 19 and/or between the conductor layer 19 and the insulating cover layer 20. Alternatively, monomeric solution such as polyamic acid resin is applied to the conductor layer 19 of a metal foil to form a film and then dried and cured to form the insulating base layer 18 directly on the conductor layer 19, first. Then, the conductor layer 19 is formed into the wired circuit pattern mentioned above by the subtractive process. Thereafter, monomeric solution such as polyamic acid resin is applied to the insulating base layer 18 including the conductor layer 19 to form a film and then dried and cured to form the insulating cover layer 20 directly on the conductor layer 19. When the conductive board 25 is formed directly on the insulating base layer 18, a two-layer substrate (a substrate formed by a metal foil such as a copper foil being laminated directly on each side of the insulating base layer 18 of a polyimide film or a like film) may be used. In this case, the metal foil on one side of the insulating base layer 18 is formed in the form of the conductor layer 19 having the wired circuit pattern mentioned above by the subtractive process. Thereafter, the monomeric solution such as polyamic acid resin is applied to the insulating base layer 18 including the conductor layer 19 to form a film and then dried and cured to form the insulating cover layer 20 directly on the conductor layer 19.

Thereafter, the relay flexible wiring circuit board 1 thus formed is opened at the front end portion, the rear end portion and the intermediate portion by a known boring method, such as drilling, laser-abrasion, chemical etching, and plasma-etching, to expose the conductor layer 19 from the openings, thereby forming the suspension-board-side connection terminal portion 11, the connector-side terminal portion 22, and IC-side terminal portion 23, respectively.

When the monomeric solution, such as polyamic acid resin, is formed into a film to thereby form the insulating cover layer 20, a sensitizing agent, such as 1,4-dihydropyridine derivative, may be mixed in the monomeric solution to form a photosensitive film. By exposing this photosensitive film to light and developing it by the photolithography process, the suspension-board-side connection terminal portion 11, the connector-side terminal portion 22 and IC-side terminal portion 23 can all be formed at the same time that the insulating cover layer 20 is formed.

Then, the ground layer 17 is formed on the side opposite to the side of the insulating cover layer 20 where the suspension-board-side connection terminal portion 11 is formed, to oppose to the suspension-board-side connection terminal portion 11.

The ground layer 17 is formed in the following process, for example. First, the conductive board 25 is laminated on the insulating base layer 18 in such a relation that the opening 27 corresponds to (overlaps with) either of the first terminal portion 13 and the second terminal portion 14 (the second terminal portion 14 (on the write line 21W side) in the illustrated embodiment).

In order to laminate the conductive board 25 directly on the insulating base layer 18, the metal foil formed on the other side of the two-layer substrate of the insulating base layer 18 mentioned above may be etched at the same time that the conductor layer 19 is formed, to form the conductive board 25 into the above-mentioned form (the configuration having the opening 27).

The conductive board 25 may be formed at a location at least opposed to the suspension-board-side connection terminal portion 11 in such a relation that the opening 27 can overlap with either of the first terminal portion 13 and the second terminal portion 14. For example, when the two-layer substrate mentioned above is used for lamination, the conductive board 25 may be formed on the entire surface of the insulating base layer 18 (except the opening 27) along the longitudinal direction of the relay flexible wiring circuit board 1, as indicated by a phantom line.

Alternatively, the conductive board 25 of the metal foil previously formed into a predetermined shape may be adhesively bonded to the insulating base layer 18 via the adhesive layer.

Thereafter, the stiffener board 24 is laminated on the conductive board 25. In order to laminate the stiffener board 24 on the conductive board 25, for example, the stiffener board 24 of the metal foil previously formed into a predetermined shape may be prepared and adhesively bonded to the conductive layer 25 via the adhesive layer 28. For example, Pylarux (product name/available from Du Pont-Toray Co., Ltd.) is used as the adhesive used for forming the adhesive layer 28

The stiffener board 24 serves to reinforce the relay flexible wiring circuit board 1 when bonding and the like, so that it is required to have relatively high stiffness. Preferably, the stiffener board 24 is arranged only at a part of the relay flexible wiring circuit board 1 opposed to the suspension-board-side connection terminal portion 11, because the remaining part of the relay flexible wiring circuit board 1 is required to have flexibility.

The relay flexible wiring circuit board 1 thus produced is used for connection between the suspension board with circuit 3 equipped with the magnetic head 2 and the control circuit board 4 for controlling the magnetic head 2, as shown in FIG. 1. The suspension-board-side connection terminal portion 11 at the front end portion of the relay flexible wiring circuit board 1 is connected to the wired-circuit-board-side connection terminal portion 12 of the suspension board with circuit 3 via the solder bump 26. Also, the connector-side terminal portion 22 at the rear end portion of the relay flexible wiring circuit board 1 is connected to the connector 15 via the connection pad 31 and the connector 15 is connected to the control circuit board 4.

The preamplifier IC 16 is mounted on the IC-side terminal portion 23 via the connection pad 32, so that the read signals and write signals transmitted from the suspension board with circuit 3 to the control circuit board 4 through the read lines 21R and write lines 21W are amplified by the preamplifier IC 16.

Thus, the read signals and write signals to the magnetic head 2 are amplified by the preamplifier IC 16 placed in the relay flexible wiring circuit board 1 interposed between the suspension board with circuit 3 and the control circuit board 4 and then transmitted to the control circuit board 4, while keeping the amplified state of signals.

This relay flexible wiring circuit board 1 has the construction wherein the conductive board 25 is formed at the suspension-board-side connection terminal portion 11 in such a relation that the opening 27 is formed at a portion of the conductive board 25 overlapping with one of the first terminal portion 13 and the second terminal portion 14 but is not formed at a portion of the conductive board 25 corresponding to the other of the first terminal portion 13 and the second terminal portion 14. In short, the opening 27 confronts the one of the first terminal portion 13 and the second terminal portion 14, but does not confront the other of the first terminal portion 13 and the second terminal portion 14, in other words, the conductive board 25 corresponds to the other of the first terminal portion 13 and the second terminal portion 14. This construction can allow reduction in capacitance at the connection points between the read wires 6R and write wires 6W of the suspension board with circuit 3 and the first and second terminal portions 13, 14 connected thereto, to control the characteristic impedance.

Hence, the relay flexible wiring circuit board 1 thus constructed can achieve improvement in signal transmission efficiency for the suspension board with circuit 3 having the read wires 6R and write wires 6W and the read lines 21R and write lines 21W formed with fine pitch or for the transmission of high-frequency signals.

In this relay flexible wiring circuit board 1, the opening 27 is formed in the conductive board 25 but no such opening is formed in the stiffener board 24. By virtue of this, the strength of the relay flexible wiring circuit board 1 can be held reliably when bonding and the like to contribute to enhancement of bonding reliability. Also, this arrangement of the conductive board 25 and the stiffener board 24 can produce controlled characteristic impedance in wide range applications, depending on its intended purposes and use.

Figure 4:
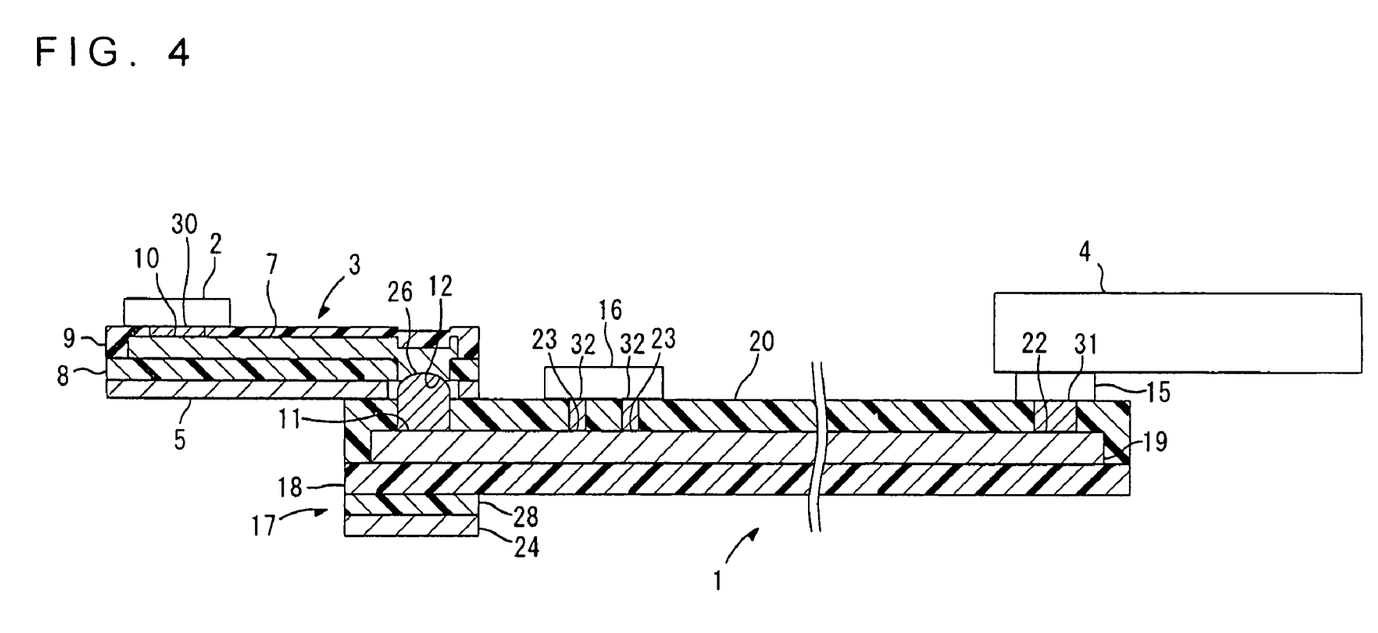
FIG. 4 is a sectional view taken along the longitudinal direction of another embodiment of the wired circuit board of the present invention (having a ground layer of a stiffener board)
Figure 5:
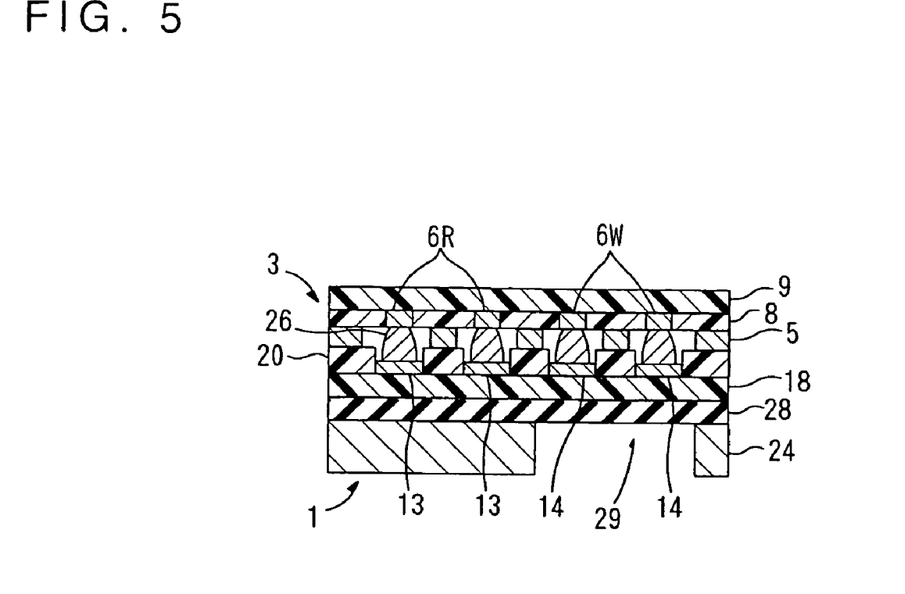
FIG. 5 is a sectional view taken along a direction orthogonal to the longitudinal direction of the wired circuit board shown in FIG. 4 at a connection terminal portion thereof on a suspension board side.
Figure 6:
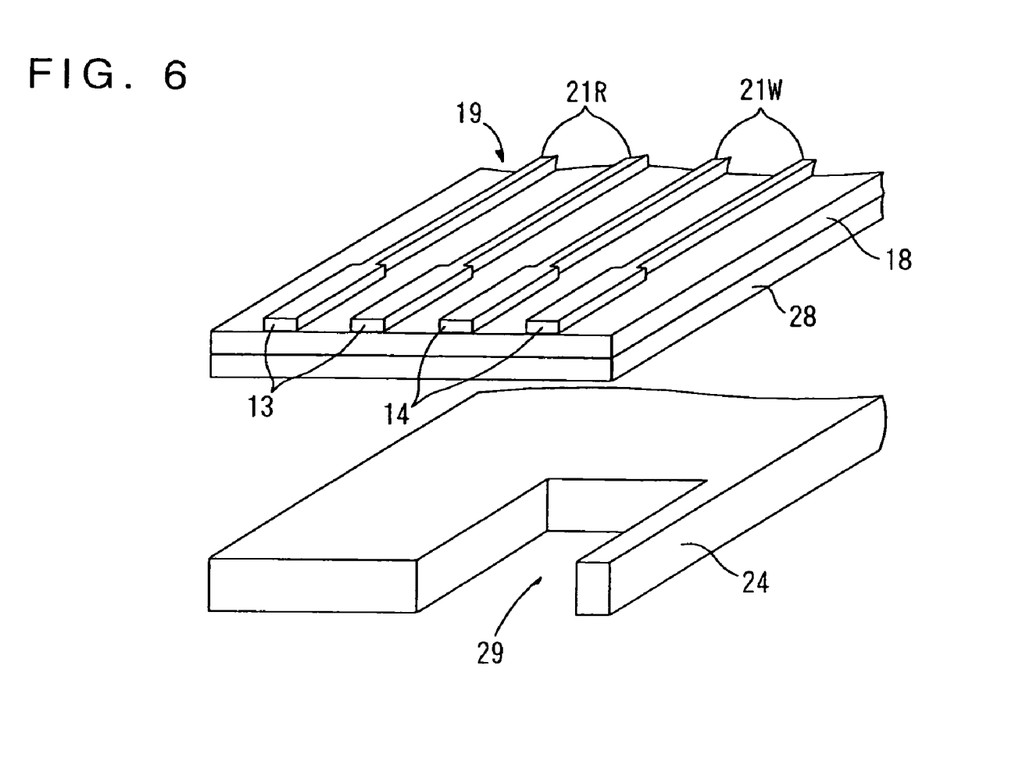
FIG. 6 is a perspective view of a principal part of the wired circuit board shown in FIG. 4 at the connection terminal portion thereof on the suspension board side.

Although the ground layer 17 of the relay flexible wiring circuit board 1 comprising the conductive board 25 having the opening 27 and the stiffener board 24 has been illustrated above (FIGS. 2 and 3), the ground layer 17 may be formed by the stiffener board 24 only, without providing the conductive board 25, as shown in FIGS. 4 to 6. The same reference numbers in FIGS. 4 to 6 refer to corresponding members or parts to those of FIGS. 1 to 3, so the description thereon is omitted.

In FIGS. 4 to 6, the ground layer 17 has the stiffener board 24 only. Also, the stiffener board 24 has a generally rectangular opening 29 formed at a location at least opposed to the suspension-board-side connection terminal portion 11 in such a relation that the opening 29 corresponds to either of the first terminal portion 13 and the second terminal portion 14 (the second terminal portion 14 (on the write line 21W side) in FIGS. 5 and 6).

For example, this stiffener board 24 can be formed in such a process that the opening 29 is previously formed in the metal foil by punching, first, and, then, the stiffener board 24 is laminated on the insulating base layer 18 via the adhesive layer 28 in such a relation that the opening 29 corresponds to (overlaps with) the second terminal portion 14.

The stiffener board 24 may be adhesively bonded directly to the insulating base layer 18. Usually, the stiffener board 24 is provided at the location opposed to the suspension-board-side connection terminal portion 11 only.

This relay flexible wiring circuit board 1 has the construction wherein the stiffener board 24 is formed at the suspension-board-side connection terminal portion 11 in such a relation that the opening 29 is formed at a portion of the stiffener board 24 corresponding to one of the first terminal portion 13 and the second terminal portion 14 but is not formed at a portion of the stiffener board 24 corresponding to the other of the first terminal portion 13 and the second terminal portion 14. In short, the opening 29 confronts the one of the first terminal portion 13 and the second terminal portion 14, but does not confront the other of the first terminal portion 13 and the second terminal portion 14, in other words, the stiffener board 24 confronts the other of the first terminal portion 13 and the second terminal portion 14. This construction can allow reduction in capacitance at the connection points between the read wires 6R and write wires 6W of the suspension board with circuit 3 and the first and second terminal portions 13, 14 connected thereto, to control the characteristic impedance, as is the case with the embodiment mentioned above.

Hence, the relay flexible wiring circuit board 1 thus constructed can also achieve improvement in signal transmission efficiency for the suspension board with circuit 3 having the read wires 6R and write wires 6W and the read lines 21R and write lines 21W formed with fine pitch or for the transmission of high-frequency signals.

Although the relay flexible wiring circuit board 1 having the insulating cover layer 20 has been illustrated above, the insulating cover layer 20 is not necessarily indispensable, depending on its intended purposes and use applications.

No particular limitation is imposed on the wired-circuit-board-side connection terminal portion 12 of the suspension board with circuit 3. It may be in the form of a known terminal portion, such as a flying lead terminal portion.

EXAMPLES

While in the following, the present invention will be described in further detail with reference to Example and Comparative Examples, the present invention is not limited to any Examples and Comparative Examples.

1) Production of Relay Flexible Wiring Circuit Board

Example 1

A double-sided copper clad laminate (ESPANEX (product name) available from Nippon Steel Chemical Co., Ltd.) having a copper foil having thickness of 12.5 μm on each side of polyimide sheet having thickness of 12.5 μm was prepared.

After the double-sided copper clad laminate was covered with a dry film photoresist, the dry film photoresist was exposed to light and then developed to form it into a resist pattern to cover a wired-circuit-pattern forming portion and a conductive-board forming portion.

Then, after the copper foil exposed from the resist was etched, the resist was removed, thereby forming, on one side of the polyimide sheet, the conductor layer of the wired circuit pattern having the read lines and the write lines having the first terminal portions and the second terminal portions, respectively, and also forming, on the other side of the polyimide sheet, the conductive board having at a portion thereof the opening overlapping with the second terminal portions.

Thereafter, a generally rectangular aluminum sheet having thickness of 100 μm was adhesively bonded to the other side of the polyimide sheet at a portion thereof opposed to the first terminal portions and the second terminal portions via an adhesive layer of epoxy adhesive having thickness of 10 μm. The flexible wired junction board was produced in this manner.

Example 2

A single-sided copper clad laminate (ESPANEX (product name) available from Nippon Steel Chemical Co., Ltd.) having a copper foil having thickness of 12.5 μm on one side of polyimide sheet having thickness of 12.5 μm was prepared.

After the single-sided copper clad laminate was covered with a dry film photoresist, the dry film photoresist was exposed to light and then developed to form it into a resist pattern to cover a wired-circuit-pattern forming portion.

Then, after the copper foil exposed from the resist was etched, the resist was removed, thereby forming, on one side of the polyimide sheet, the conductor layer of the wired circuit pattern having the read lines and the write lines having the first terminal portions and the second terminal portions, respectively.

Thereafter, a generally rectangular aluminum sheet of 100 μm thick having, at a portion thereof opposed to the second terminal portions, an opening previously formed by punching was adhesively bonded to the other side of the polyimide sheet via an adhesive layer of epoxy adhesive having thickness of 10 μm in such a relation that the opening can overlap with the second terminal portions. The flexible wired junction board was produced in this manner.

Comparative Example 1

Except that an aluminum sheet with no opening was used, the same processes as those of Example 2 were taken to produce the wired circuit board.

2) Production of Suspension Board with Circuit

After solution of photosensitive polyamic acid resin was applied to a surface of a metal sheet of stainless foil having thickness of 25 μm, it was exposed to light and then developed. Then, it was dried and cured to form an insulating base layer of polyimide resin having thickness of 10 μm (which was opened at connecting portions thereof to the first terminal portion and the second terminal portion). Then, a wired circuit pattern of copper foil with 10 μm thickness (wired circuit pattern formed by read wires and write wires) was formed on the insulating base layer thus formed by the semi-additive process. Further, after the solution of photosensitive polyamic acid resin was applied to a surface of the copper foil, it was exposed to light and developed. Then, it was dried and cured to form an insulating cover layer of polyimide resin having thickness of 3 μm (which was opened at a connecting portion thereof to a magnetic head). Thereafter, the connecting portions of the metal sheet to the first terminal portions and the second terminal portions were opened. The suspension board with circuit was produced in this manner.

3) Evaluation

The solder bumps were formed on the first terminal portions and the second terminal portions of the flexible wired junction circuits of Examples 1, 2 and Comparative Example 1. Then, the first terminal portions and the second terminal portions were connected to the read wires and the write wires of the suspension board with circuit thus produced via the solder bumps. Then, the characteristic impedances at the connection points on the relay flexible wiring circuit board side, the connection terminal portion side, and the suspension board with circuit side were measured by a time domain reflectometry (TDR) method. The results are shown in TABLE 1.

TABLE 1

| Write wire | Relay flexible wiring circuit board | Connection portion | Suspension board with circuit |
|---|---|---|---|
| Example 1 | 90 Ω | 70 Ω | 80 Ω |
| Example 2 | 95 Ω | 80 Ω | 80 Ω |
| Comparative Example 1 | 100 Ω | 60 Ω | 80 Ω |

TABLE 2

| Read wire | Relay flexible wiring circuit board | Connection portion | Suspension board with circuit |
|---|---|---|---|
| Example 1 | 70 Ω | 50 Ω | 50 Ω |
| Example 2 | 75 Ω | 50 Ω | 50 Ω |
| Comparative Example 1 | 100 Ω | 60 Ω | 50 Ω |

It is clearly seen from TABLE 1 that Examples 1 and 2 are smaller than Comparative Example 1 in difference of the characteristic impedance among the respective parts.

While the illustrative embodiments of the present invention are provided in the above description, such is for illustrative purpose only and it is not to be construed restrictively.

Modification and variation of the present invention that will be obvious to those skilled in the art is to be covered by the following claims.

What is claimed is:

1. A wired circuit board for connecting to an external circuit that includes external read wires and external write wires, the wired circuit board comprising:
   an insulating layer having a first surface and a second surface that oppose each other;
   a plurality of read lines formed on the first surface of the insulating layer;
   a plurality of write lines formed on the first surface of the insulating layer;
   a connection terminal portion formed on the first surface of the insulating layer to electrically couple the wired circuit board and the external circuit, the connection terminal portion comprising:
   first terminals that are connected to the plurality of read lines and are configured to be electrically coupled to the external read wires of the external circuit; and
   second terminals that are connected to the plurality of write lines and are configured to be electrically coupled to the external write wires of the external circuit;
   a ground layer formed on the second surface of the insulating layer; and
   an opening formed in the ground layer proximate to the connection terminal portion and positioned to overlap with one of the first terminals or the second terminals and not to overlap with the other of the first terminals or the second terminals, wherein the opening is adapted to control characteristic impedances at the connection terminal portion between the first terminals and the external read wires and between the second terminals and the external write wires;
   wherein the ground layer comprises:
      a stiffener board, and
      a conductive board interposed between the insulating layer and the stiffener board, wherein the opening is formed in the conductive board;
   wherein the conductive board comprises a metal foil selected from the group consisting of copper, nickel, gold, solder and alloys thereof.

2. A wired circuit board for connecting to an external circuit that includes external read wires and external write wires, the wired circuit board comprising:
   an insulating layer having a first surface and a second surface that oppose each other;
   a plurality of read lines formed on the first surface of the insulating layer;
   a plurality of write lines formed on the first surface of the insulating layer;
   a connection terminal portion formed on the first surface of the insulating layer to electrically couple the wired circuit board and the external circuit, the connection terminal portion comprising:
   first terminals that are connected to the plurality of read lines and are configured to be electrically coupled to the external read wires of the external circuit; and
   second terminals that are connected to the plurality of write lines and are configured to be electrically coupled to the external write wires of the external circuit;
   a ground layer formed on the second surface of the insulating layer; and
   an opening formed in the ground layer proximate to the connection terminal portion and positioned to overlap with one of the first terminals or the second terminals and not to overlap with the other of the first terminals or the second terminals, wherein the opening is adapted to control characteristic impedances at the connection terminal portion between the first terminals and the external read wires and between the second terminals and the external write wires;
   wherein the ground layer consists essentially of a stiffener board, and wherein the opening is formed in the stiffener board.

* * * * *